United States Patent
Eberl (10) Patent No.: US 6,909,377 B2
(45) Date of Patent: Jun. 21, 2005

(54) ILLUMINATION DEVICE WITH LIGHT EMITTING DIODES (LEDS), METHOD OF ILLUMINATION AND METHOD FOR IMAGE RECORDING WITH SUCH AN LED ILLUMINATION DEVICE

(75) Inventor: Heinrich Alexander Eberl, Probatried (DE)

(73) Assignee: Arnold & Richter Cine Technik GmbH & Co. Betriebs KG, Munich (DE)

(*) Notice: Subject to any disclaimer, the term of this patent is extended or adjusted under 35 U.S.C. 154(b) by 151 days.

(21) Appl. No.: 10/312,785

(22) PCT Filed: Jun. 22, 2001

(86) PCT No.: PCT/DE01/02349

§ 371 (c)(1),
(2), (4) Date: Dec. 27, 2002

(87) PCT Pub. No.: WO02/01921

PCT Pub. Date: Jan. 3, 2002

(65) Prior Publication Data

US 2003/0107887 A1 Jun. 12, 2003

(30) Foreign Application Priority Data

Jun. 27, 2000 (DE) .......................................... 100 31 303

(51) Int. Cl.[7] .............................................. B60Q 1/00
(52) U.S. Cl. ............................. 340/815.4; 340/815.43; 340/815.45; 340/815.53; 340/815.65; 345/82; 345/589; 315/291; 362/83.1
(58) Field of Search .......................... 340/815.4, 815.43, 340/815.45, 815.47, 815.49, 815.5, 815.53, 815.56, 815.65, 815.75; 345/82, 83, 589, 257, 312; 315/291; 362/83.1, 800

(56) References Cited

U.S. PATENT DOCUMENTS

| | | | |
|---|---|---|---|
| 4,887,074 A | | 12/1989 | Simon et al. |
| 5,350,977 A | * | 9/1994 | Hamamoto et al. ......... 315/291 |

(Continued)

FOREIGN PATENT DOCUMENTS

| | | |
|---|---|---|
| DE | 39 17 101 A1 | 11/1990 |
| DE | 296 07 270 U1 | 8/1996 |

(Continued)

OTHER PUBLICATIONS

English Translation of International Preliminary Examination Report of corresponding International Application No. PCT/DE01/02349, dated Oct. 29, 2002.

(Continued)

*Primary Examiner*—Davetta W. Goins
(74) *Attorney, Agent, or Firm*—Christie, Parker & Hale, LLP (57) ABSTRACT

Illumination device with light emitting diodes (LED) and an LED support element on which a number of light pixels are arranged which emit light are disclosed. The light pixels each comprise a number of LEDs with emission wavelengths suitable for additive color mixing of the light from the light pixels. A controller is provided on the LED support element, for setting a color temperature and intensity parameter of the additively color mixed light of each individual light pixel. The controller assigns electrical LED currents to the color temperature and intensity parameters and controls the LEDs in the light pixels using the assigned LED currents. Control devices measure the color temperature and intensity of the emitted light of at least one light pixel, compare the measured and the pre-set color temperature and intensity parameters of the light pixel and in the case of a difference in the measured and pre-set color temperature and intensity parameters regulates the controller such that the emitted light from the light pixel has the pre-set color temperature and intensity parameters.

22 Claims, 2 Drawing Sheets

U.S. PATENT DOCUMENTS

| | | | |
|---|---|---|---|
| 6,016,038 A | * | 1/2000 | Mueller et al. ............. 315/291 |
| 6,211,626 B1 | * | 4/2001 | Lys et al. ................... 315/291 |
| 6,583,791 B2 | * | 6/2003 | Berryman et al. .......... 345/589 |
| 6,623,151 B2 | * | 9/2003 | Pederson ............... 340/815.45 |

FOREIGN PATENT DOCUMENTS

| | | |
|---|---|---|
| DE | 199 42 177 A1 | 3/2001 |
| EP | 0 516 398 A2 | 12/1992 |
| EP | 0 921 568 A2 | 6/1999 |
| EP | 0 952 387 A2 | 10/1999 |
| EP | 0 966 183 A1 | 12/1999 |
| EP | 1 077 444 A2 | 2/2001 |
| EP | 1 113 709 A2 | 7/2001 |
| FR | 2 640 791 A2 | 6/1990 |
| GB | 2 176 042 A | 12/1986 |
| WO | WO 97/23912 | 9/1997 |
| WO | WO 97/48134 | 12/1997 |
| WO | WO 98/02855 | 1/1998 |
| WO | WO 98/40665 | 9/1998 |
| WO | WO 98/49872 | 11/1998 |
| WO | WO 99/10867 | 3/1999 |
| WO | WO 99/30537 | 6/1999 |
| WO | WO 99/31560 | 6/1999 |
| WO | WO 99/56303 | 11/1999 |

OTHER PUBLICATIONS

International Search Report of PCT/DE01/02349, dated Nov. 30, 2001.

International Preliminary Examination Report of PCT/DE01/02349, dated Oct. 29, 2002.

* cited by examiner

ILLUMINATION DEVICE WITH LIGHT EMITTING DIODES (LEDS), METHOD OF ILLUMINATION AND METHOD FOR IMAGE RECORDING WITH SUCH AN LED ILLUMINATION DEVICE

CROSS-REFERENCE TO RELATED APPLICATION

This application is a National Phase Patent Application of International Application Number PCT/DE01/02349, filed on Jun. 22, 2001, which claims priority of German Patent Application Number 100 31 303.5, filed Jun. 27, 2000.

BACKGROUND

In comparison with a light source in which the light is generated by an incandescent body, for example, a thin wire filament, an LED has several advantages, such as better efficiency, lower heat loss, higher mechanical stability, and longer service life. At the beginning of the technical development, however, LEDs had comparatively low light outputs. In particular, the development of powerful LEDs in the shortwave visible spectral range of light proved problematic. Consequently, the generation of comparatively powerful white light by additive color mixing of the light of at least three LEDs that have a red, a green, and a blue emission wavelength or by an adequately broad visible LED emission spectrum of a single LED was not possible. For these reasons, for a long time, LEDs did not come into use for illumination purposes in which white light is necessary.

Now, it is possible to produce LEDs with emission wavelengths in all ranges of the visible light spectrum with light outputs that satisfy the requirements of a large number of conventional incandescent illumination devices. The use of an LED illumination device is thus often only an issue of price.

From DE 3,917,101 A1, a conventional incandescent illumination system is known, which enables the mixing of various hues and intensities of the emitted light.

WO99/31560 discloses a large number of devices and methods, in which in each case LEDs are used as light sources. LED illumination devices are disclosed, for example, in WO 97/48134, WO 98/40665, and WO 99/30537. In particular, in WO 98/40665 and WO 99/30537, devices are described in which the light is generated by a large number of LED light pixels arranged on a flat support. Each light pixel includes three LEDs: one LED with an emission wavelength in the red spectral range, one in the green, and one in the blue. By means of the controllable additive color mixing of the red, green, and blue LED light, the LED illumination device can emit light of any color temperature desired.

However, due to degeneration of the LED material, in particular of the light emitting layers, the intensity and wavelength of the LED light emitted changes over time. Despite LED currents kept constant, this results in the fact that the light of the LED illumination device also has altered intensity and color temperature. The known LED illumination devices have the disadvantage that such a change in color temperature and intensity of the light of the LED illumination device has to be accepted. However, precisely in professional sectors of use, the dependability that the illumination device emits light of the desired color temperature and intensity is of critical significance.

Consequently, the object of the invention is to provide an illumination device with light emitting diodes (LEDs) that can emit light of a large number of pre-set color temperature and intensity parameters, whereby the color temperature and the intensity parameters of the light emitted correspond to the pre-set color temperature and intensity parameters, with high dependability during the entire service life of the device.

SUMMARY OF THE INVENTION

Accordingly, the illumination device has an LED support element that can be configured as either a flat or a curved surface. A large number of light emitting light pixels are arranged on the LED support element, for example, as an array. These light pixels include in each case a plurality of LEDs with emission wavelengths that are suitable for the additive color mixing of the light emitted by the light pixel. In order to be able to produce all hues of the visible light spectrum, the combination of three LEDs with emission wavelengths in the red, in the green, and in the blue range of the visible light spectrum is necessary.

For true-color appearance of illuminated objects, it is, however, further necessary that the spectral emission bandwidths of the red, green, and blue emitting LEDs cover the entire visible spectral range. If there is a spectral gap between the emission bandwidths of two LEDs, it is indeed possible that a hue that falls within this spectral gap can be generated by the appropriate mixing of red, green, and blue light; however, in the illumination of an object that has this hue, it is inevitable that there are color errors with regard to the light reflected from the object. This effect results from the fact that the illuminated object has different reflection coefficients for the light of the different wavelengths such that, in reflection, a distorted hue results due to the changed mixing ratio of the different light components. To compensate for this effect, it is possible, for example, to use a broadband emitting white light LED in each light pixel in addition to the LEDs with emission wavelengths in the red, green, and blue spectral range.

In addition, the illumination device has a controller which enables pre-setting a color temperature parameter and an intensity parameter for the additively color mixed light of each individual light pixel. The controller assigns LED currents according to these pre-set parameters and controls the LEDs of the light pixels using the assigned LED currents.

The illumination device includes regulating means that measure the color temperature and intensity of the light of at least one light pixel, compares the measured color temperature and intensity parameters with the corresponding pre-set parameters, and, in the event of deviations of the measured parameters from the pre-set parameters, stabilizes the emitted light of the light pixel by means of the controller such that the measured parameters match the pre-set parameters.

In an advantageous embodiment, the regulating means include a semiconductor sensor unit that is suitable for measuring the respective red, green, and blue spectral components of the light of the light pixels. From the ratio and the size of the respective measured values, it is possible to determine color temperature and intensity parameters of the light emitted. The comparison and regulation unit associated with the semiconductor sensor unit compares the measured color temperature and intensity parameters with the pre-set parameters. If the parameters differ, the comparison and regulation unit causes the controller of the LED support element to adjust the LED currents such that no differences between measured and pre-set color temperature and brightness parameters persist.

It is further advantageous to place the regulating means at a distance from the LED support element such that, for example, the heat loss of the LED support element does not result in a distortion of the measured values of the semiconductor sensor unit. With such a standoff, the light of the light pixels must be fed to the semiconductor sensor unit arranged at a distance. This is suitably accomplished using a light guide, for example, in the form of a glass or synthetic optical fiber or an integrated optic waveguide.

On the one hand, it is possible to couple the light guide to a single light pixel that is then used as a reference light source; on the other, measurement of the emitted light of each individual light pixel may be desirable. For this purpose, it is advantageous to arrange the light guide in a ring or loop shape on the LED support element such that components of the emitted light of each individual light pixel can be coupled into the light guide.

In particular, with the use of a glass or plastic fiber as a light guide, the fiber can be shaped and arranged in the region of the LED support element such that incident light that comes from the direction of the light pixels can be coupled into the light guide, whereas, for example, stray light or ambient light that strikes the light guide from other directions is only coupled into the light guide to a very small extent.

For the active control of the color temperature and intensity parameters of each individual light pixel, it is necessary to extract the light of individual light pixels from the mixture of the light from all light pixels. This is accomplished most simply by evaluating the light signals of the light pixels in the time multiplex. For this, the individual LEDs of the light pixels are suitably controlled with LED currents that are timed in the MHz range. If, for example, a time window of 10 $\mu$s is calculated per light pixel for the actively controlled generation of a number of light pulses that deliver an adequate detector signal, it is possible to actively control regulation of 100 light pixels in succession within 1 ms. This yields an illumination frequency of 1 kHz such that disruptive beat effects, for example, during recording of an illuminated scene with a motion picture camera can occur only with correspondingly high frame rates.

For the purpose of simple manipulation, it is advantageous to arrange the LED support element in a spotlight housing.

Moreover, a viewing camera to image a scene illuminated with the projector may be associated with the spotlight housing. The viewing camera is arranged either inside or outside the spotlight housing and fixedly attached to the spotlight housing.

It is advantageous to use a semiconductor camera (CCD, CMOS) as viewing camera. This may be very small, enabling its space-saving arrangement inside the spotlight housing.

In another embodiment, the controller has an operator terminal with a screen. This screen enables convenient user guidance of the illumination device and can, moreover, display the image of the illuminated scene recorded by the viewing camera.

Using the light pixels arranged on the LED support element, it is possible, in all embodiments of the illumination device, to simulate any two-dimensional color progression and intensity profile of the light emitted by the illumination device, simply, with the use of the controller. For this, the LEDs of the light pixels would have to be controlled respectively by the corresponding currents. Compared to this, with the use of a conventional incandescent spotlight, an individual filter element is necessary for each color progression and intensity profile. With the use of the illumination device, such filter elements are superfluous.

With an illumination device with a viewing camera, the possibility also exists to actively monitor and control the illumination of a scene. For this, the scene to be illuminated can be displayed on the screen of the controller using the viewing camera. Referring to this image, the user then defines the desired illumination conditions of the scene to be illuminated. Then, the controller determines the associated color progression and intensity profile and controls the LEDs of the LED support element with the corresponding currents. The image of the illuminated scene is then recorded with the viewing camera; the controller evaluates it, and compares it with the illumination conditions desired by the user. If, in this process, for example, because of special reflection characteristics of the scene illuminated, deviations occur, the controller can readjust the LED currents until the illumination conditions desired by the user are set.

An additional advantageous operating technique consists in the use of the illumination device according to the invention in the recording of images of a moving body with a camera. For this, the illumination device makes illumination light available for the body that is moving in front of a background which is stationary relative to the camera. During or between recording of the individual images of the moving body with the camera, the color temperature of the illumination light is changed. The change in the color temperature of the illumination light can be pre-set as a function of time. Thus, in each image of the moving body, the information concerning the movement time already elapsed is encoded using the color in which the moving body is imaged.

The more color temperatures the illumination light has during the recording of an individual image, the more colorless, i.e. gray or white, the background appears, in front of which the moving body is clearly depicted in the different color temperatures at different image positions.

To optimize this effect, it is necessary that the illumination light have all visible spectral colors during the recording time between a starting time and ending time. It is advantageous to change the color temperature of the illumination light during the recording time stepwise or continuously from the violet to the red range of the spectrum, because, in this fashion, the movement time is encoded by the known color sequence of the white light spectrum. For the reason mentioned, the reverse direction, i.e., from the red to the violet spectral range, also presents an advantageous possibility for the changing of the color temperature of the illumination light.

If the color temperature is changed between the recording of individual images, a subsequent overlapping of the individual images is necessary to obtain the same graphic effect. For such image postprocessing, it is advantageous if the camera used delivers digital image signals such that the subsequent overlapping can be performed using a computer with appropriate software.

The time resolution in the presentation of the movement of the body is obtained from the quotient of the recording time divided by the number of possible color temperatures of the illumination light. The time resolution may, however, be increased significantly by repeating the illumination of the body with a temporally defined sequence of all generatable color temperatures at periodic intervals. Thus, the theoretically obtainable time resolution is the time constant that the illumination device requires to switch between two color temperatures. However, in practice, the minimum image recording time required by the camera to be able to image the illuminated body "in true color" will be the limiting factor.

With uniform movement of the body, it is advantageous to change the color temperature proportionally with the time of movement.

If images of a spatially and temporally periodic body movement are recorded with a periodicity time T, it is advantageous if the recording time corresponds to one-half the periodicity time T/2, in order to avoid the overlapping of back and forth motion of the body in the image. In particular, with very small periodicity times T, the body is suitably illuminated during a large number of successive back and forth motions of the duration T/2 with light of identical color coding. Thus, the motion of the body is imaged in a sort of stroboscopic operation of the illumination device.

BRIEF DESCRIPTION OF DRAWINGS

Several exemplary embodiments of the illumination device are described with reference to the following figures. They depict.

Figure 1:
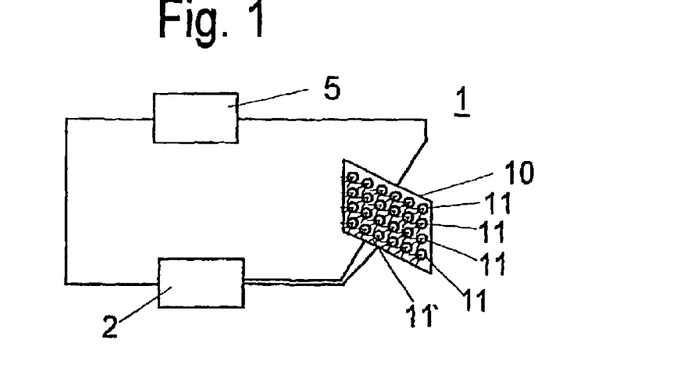
FIG. 1 a schematic of the illumination device.

FIG. 1 schematically depicts the illumination device 1 according to the invention. The LED support element 10 is designed as a flat or curved surface and has on its surface a large number of light pixels 11. These light pixels 11 are arranged close to each other and form a light surface on the LED support element 10. The flat LED support element 10 may have any geometric shape. Round or rectangular light surfaces are the most simple to implement on correspondingly round or rectangular LED support elements 10.

Each light pixel 11 includes at least three LEDs. The first LED has a red emission wavelength; the second, green; and the third, blue, whereby the emission wavelengths are suitable for the additive color mixing of all color temperatures of visible light and the emission bandwidths of the three LEDs cover the entire visible spectral range. If there are spectral gaps between the emission bandwidths of the three LEDs, the use of an additional white LED, whose broad emission spectrum closes the gap between the colored LEDs, is necessary.

The LEDs of the light pixels are supplied with electrical current by means of a controller 5. The LED operation takes place with current pulses such that the intensity of the LED light emitted can be influenced by modulating the pulse width. Thus, the mixing ratios of the three color components of the additively mixed LED light and, consequently, the resulting color temperature of each individual light pixel 11 can be controlled.

The controller 5 assigns the corresponding LED currents to pre-set parameters for color temperature and intensity of the light pixels and controls the LEDs with the assigned currents.

The regulating means 2 measures color temperature and intensity of the emitted light of at least one light pixel 11' of the LED support element 10, compares the measured parameters with the parameters for color temperature and intensity pre-set by the control unit 5, and causes the control unit 5 to adjust the LED currents until the measured parameters correspond to the pre-set parameters.

Figure 2:
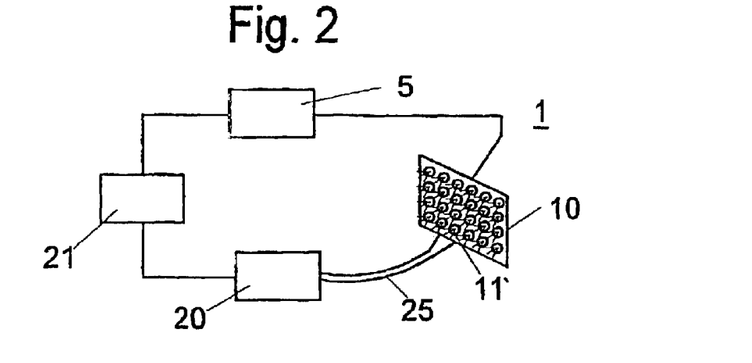
FIG. 2 a first possible embodiment of the device according to FIG. 1.

FIG. 2 depicts a possible embodiment of the illumination device 1 depicted schematically in FIG. 1. A semiconductor sensor unit 20 measures the color temperature and intensity of the light of at least one light pixel 11' of the LED support element 10 that is supplied by means of a light guide 25 from the LED support element 10 to the semiconductor sensor unit 20. Both optical glass and plastic fibers may be used as the light guide 25. Also advantageous is the use of an integrated optical light guide detector system. This is a component in which the light guide and detector are produced on a common substrate in thin-film semiconductor technology. Through the use of such a component, the expensive optical coupling of a separate light guide to the semiconductor sensor unit is eliminated in the assembly of the illumination device 1.

It is advantageous if the semiconductor sensor unit 20 has three individual detectors, the first of which generates the signal of the red LED light; the second, the signal of the green; and the third, the signal of the blue. This measurement arrangement can be implemented in a simple fashion by the use of appropriate transmission filters upstream from the respective individual detectors.

A comparison and regulation unit 21 compares the color temperature and intensity parameters measured by the semiconductor sensor unit 20 with the parameters pre-set by the controller 5. In the event of a deviation, the comparison and regulation unit 21 causes the controller 5 to adjust the LED currents until the measured parameters match the pre-set parameters.

With the light surfaces formed by the light pixels 11 on the LED support element 10, it is possible to implement any color progression and intensity profile. For example, the Gaussian profile of a conventional incandescent spotlight can be simulated as an intensity profile.

The semiconductor sensor unit 20 and the comparison and regulation unit 21 ensure that the color temperature and intensity parameters of the emitted light of the light pixels 11' correspond to the color temperature and intensity parameters pre-set by the controller 5 with high dependability during the entire service life of the illumination device 1.

Figure 3:
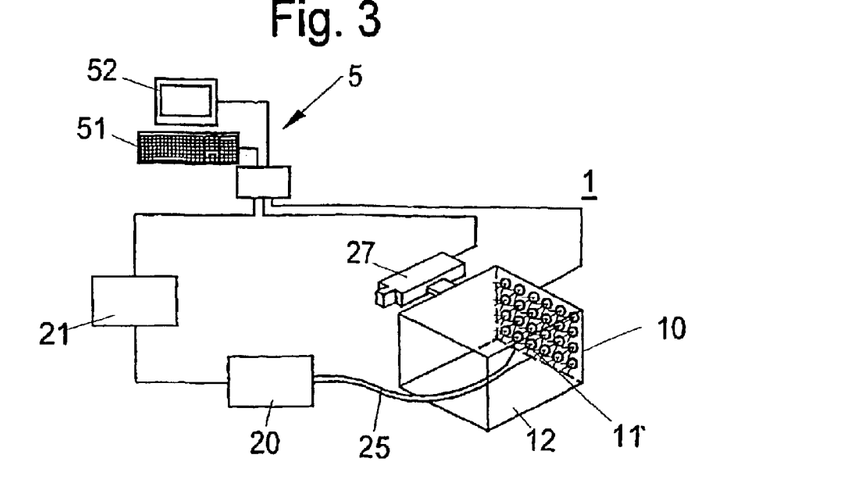
FIG. 3 another possible embodiment of the illumination device.

The embodiment of the illumination device 1 depicted in FIG. 3 corresponds largely to the device depicted in FIG. 2. Consequently, the same reference characters are used for the same components.

The LED support element 10 is arranged in a spotlight housing 12. A viewing camera 27 is associated with the spotlight housing. The viewing camera 27 is connected with the controller 5 and images a scene to be illuminated with the illumination device on the screen 52 of the controller 5. Additionally, the controller 5 has input means 51, for example, a computer keyboard with a mouse. This enables convenient operation of the illumination system 1 by a user.

So that the spotlight housing 12 is easy to manipulate, it is useful to design the viewing camera 27 as a miniature CCD camera so that it can be mounted with no problems inside the spotlight housing 12.

The embodiment of the illumination device 1 depicted offers the possibility for a user to pre-set desired illumination conditions of the scene using the scene to be illuminated imaged on the screen 52 via the input means 51. The control device 5 then determines the corresponding LED currents and controls the light pixels 11 of the LED support element 10 accordingly.

The now illuminated scene is again displayed on the screen 52 by means of the viewing camera 27, whereupon the controller 5 evaluates the differences between the illumination conditions desired by the user and those imaged by viewing camera 27, using an appropriate software program. Then, the current control of the light pixels 11 can be adjusted, either manually by the user or automatically by a software program of the controller 5.

With the use of an optical fiber as the light guide 25, it is possible to integrate the semiconductor sensor unit 20 and the comparison and regulation unit 21 together in the housing of the controller 5. This yields a single compact equipment unit that merely has to be connected to the spotlight housing by an electrical cable and the light guide 25.

Moreover, the controller 5 may have interfaces that permit networking and central control of a large number of illumination devices 1.

Figure 4:
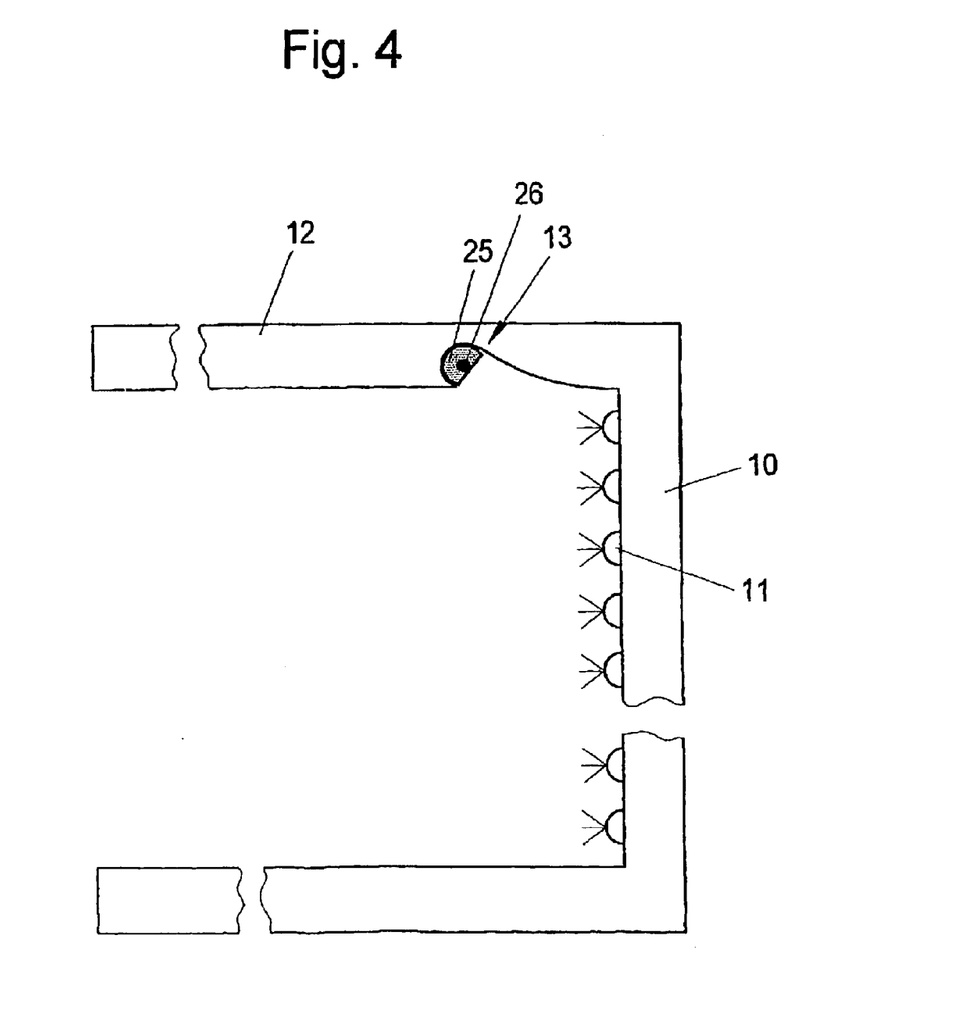
FIG. 4 a longitudinal section through a possible embodiment of a spotlight of the illumination device.

FIG. 4 depicts an advantageous arrangement of the light guide 25 and LED support element 10 in a spotlight housing 12. Here, the end section of the light guide 25 arranged in the spotlight housing 12 runs out in a throat-like section 13 substantially parallel to the LED support element 10. The opening of this throat-like section 13 points in the direction of the LED support element 10 such that a portion of the light of each light pixel 11 strikes the light guide, but no interfering ambient light that falls directly into the spotlight housing 12 can be coupled into the light guide 25. The region of the light guide 25 arranged in the throat-like section 13 is configured such that the light guiding layer 26 has a boundary surface relative to the air inside the spotlight housing 12. This can be implemented, for example, by sanding a glass fiber along its lengthwise direction. This ensures that an adequate portion of the light of the light pixels 11 is coupled into the light guide 25 and arrives at the detector unit 20.

What is claimed is:

1. An illumination device with light emitting diodes (LEDs) comprising:
    an LED support element, on which a large number of light pixels that emit light are arranged, whereby the light pixels are comprised of a plurality of LEDs that have different emission wavelengths suitable for additive color mixing of light emitted by the light pixels;
    a controller associated with the LED support element, wherein the controller pre-sets a color temperature parameter and an intensity parameter for the additively color mixed light emitted by each individual light pixel, whereby the controller assigns the electrical LED currents corresponding to the pre-set color temperature and intensity parameters and controls the LEDs of the light pixels with the LED currents assigned,
    regulation means that measures the color temperature and intensity of the emitted light of at least one light pixel of the LED support element, and wherein the regulation means compares the measured color temperature and intensity parameters with the pre-set color temperature and intensity parameters of the at least one light pixel, and wherein the regulation means stabilizes the emitted light of the at least one light pixel by means of the controller in response to deviations of the measured color temperature and/or intensity parameters from the pre-set color temperature and intensity parameters such that the emitted light of the at least one light pixel has the pre-set color temperature and intensity parameters.

2. The illumination device according to claim 1 wherein the regulation means comprises a semiconductor sensor unit for the light emitted by the at least one light pixel and a microprocessor-controlled comparison and regulating unit associated with the semiconductor sensor unit.

3. The illumination device according to claim 2 further comprising at least one light guide arranged on the LED support element, wherein the light guide guides the emitted light of the at least one light pixel to the semiconductor sensor unit arranged at a distance from the LED support element.

4. The illumination device according to claim 3 wherein the light guide is arranged in a loop or ring shape on the LED support element such that portions of the light emitted by all the light pixels are coupled into the light guide.

5. The illumination device according to claim 4 wherein the light guide comprises a glass or plastic fiber and is shaped in the region of the LED support element such that only light that strikes the light guide from the direction of the light pixels is coupled into it.

6. The illumination device according to claim 1 wherein the controller controls the individual LEDs of the light pixels with current pulses that are timed in the MHz range.

7. The illumination device according to claim 1 wherein the LED support element is arranged in a spotlight housing.

8. The illumination device according to claim 7 wherein a section of the light guide runs out in the spotlight housing substantially parallel to the LED support element and wherein this section of the light guide is designed such that light of the light pixels can be coupled into the light guide.

9. The illumination device according to claim 8 wherein the section of the light guide is arranged in a throat-like shaped section of the spotlight housing and that an opening direction of the throat-like shaped section is aimed at the LED support element such that no ambient light falling directly into the spotlight housing can be coupled into the light guide.

10. The illumination device according to claim 9 further comprising a viewing camera associated with the spotlight housing and the controller wherein the viewing camera images a scene illuminated with the illumination device, and wherein the viewing camera is fixedly attached to the spotlight housing, either inside or outside it.

11. The illumination device according to claim 10 wherein the viewing camera comprises a CCD or CMOS camera.

12. The illumination device according to claim 1 wherein the controller comprises a screen and data input means.

13. An illumination method comprising:
    providing an illumination device comprised of,
        an LED support element, on which a large number of light pixels that emit light are arranged, whereby the light pixels are comprised of a plurality of LEDs that have different emission wavelengths suitable for additive color mixing of light emitted by the light pixels;
        a controller associated with the LED support element, wherein the controller pre-sets a color temperature parameter and an intensity parameter for the additively color mixed light emitted by each individual light pixel, whereby the controller assigns the electrical LED currents corresponding to the pre-set color temperature and intensity parameters and controls the LEDs of the light pixels with the LED currents assigned, and
    regulation means that measures the color temperature and intensity of the emitted light of at least one light pixel of the LED support element, and wherein the regulation means compares the measured color temperature and intensity parameters with the pre-set color temperature and intensity parameters of the at least one light pixel, and wherein the regulation means, stabilizes the emitted light of the at least one light pixel by means of the controller in response to deviations of the measured color temperature and/or intensity parameters from the pre-set color temperature and intensity parameters such that the emitted light of the at least one light pixel has the pre-set color temperature and intensity parameters, and the controller controlling the color and intensity parameters of the light emitted by the individual light pixels such that two-dimensional color progression profiles and/or intensity profiles of the light of conventional incandescent spotlights can be simulated by means of the light pixels of the LED support element.

14. A method for illumination of a scene, comprising:
providing an illumination device comprised of,
an LED support element, on which a large number of light pixels that emit light are arranged, wherein each of the light pixels are comprised of a plurality of LEDs that have different emission wavelengths suitable for additive color mixing of light emitted by the light pixels;
a controller, having a screen and data input means, wherein the controller is associated with the LED support element, and wherein the controller pre-sets a color temperature parameter and an intensity parameter for the additively color mixed light emitted by each individual light pixel, and wherein the controller assigns the electrical LED currents corresponding to the pre-set color temperature and intensity parameters and controls the LEDs of the light pixels with the LED currents assigned,
regulation means that measures the color temperature and intensity of the emitted light of at least one light pixel of the LED support element, and wherein the regulation means compares the measured color temperature and intensity parameters with the pre-set color temperature and intensity parameters of the at least one light pixel, and wherein the regulation means, stabilizes the emitted light of the at least one light pixel by means of the controller in response to deviations of the measured color temperature and/or intensity parameters from the pre-set color temperature and intensity parameters such that the emitted light of the at least one light pixel has the pre-set color temperature and intensity parameters,
a viewing camera associated with the controller, wherein the viewing camera images a scene illuminated with the illumination device;
displaying the scene to be imaged by the viewing camera on the screen of the controller, pre-setting of desired illumination conditions of the scene to be illuminated via the data input means of the controller,
determining one of the color progression and intensity profiles of the light emitted by the LED support element corresponding to the desired illumination conditions by means of the controller (5),
displaying and evaluating the image of the illuminated scene recorded with the viewing camera by means of the controller,
correcting the two-dimensional color progression and intensity profiles of the light emitted by the LED support element by means of the controller until the scene illuminated has the desired illumination relationships.

15. A method for recording images of a movement of at least one body in front of a background, comprising:
providing an illumination device to provide illumination light for the illumination of the body, the illumination device comprising,
an LED support element, on which a large number of light pixels that emit light are arranged, whereby the light pixels are comprised of a plurality of LEDs that have different emission wavelengths suitable for additive color mixing of light emitted by the light pixels;
a controller associated with the LED support element, wherein the controller presets sets a color temperature parameter and an intensity parameter for the additively color mixed light emitted by each individual light pixel, whereby the controller assigns the electrical LED currents corresponding to the pre-set color temperature and intensity parameters and controls the LEDs of the light pixels with the LED currents assigned,
regulation means that measures the color temperature and intensity of the emitted light of at least one light pixel of the LED support element, and wherein the regulation means compares the measured color temperature and intensity parameters with the pre-set color temperature and intensity parameters of the at least one light pixel, and wherein the regulation means, stabilizes the emitted light of the at least one light pixel by means of the controller in response to deviations of the measured color temperature and/or intensity parameters from the pre-set color temperature and intensity parameters such that the emitted light of the at least one light pixel has the pre-set color temperature and intensity parameters, and
a camera that records the images of the movement of the body in front of the background,
wherein the camera is stationary relative to the background during the recording of the images, and wherein the color temperature and/or intensity of the illumination light of the illumination device is changed during or between the recording of the images.

16. The method according to claim 15, wherein the movement of the body is recorded during a recording period between a starting time point and an end time point, and wherein the illumination light has a beginning color temperature in a violet spectral range at the starting time point and an ending color temperature in a red spectral range at the end time point, and has a large number of color temperatures between the red and violet spectral range of the color spectrum during the recording period.

17. The method according to claim 15, wherein the movement of the body is recorded during a recording period between a starting time point and an end time point, and wherein the illumination light has a beginning color temperature in a red spectral range at the starting time point, an ending color temperature in a violet spectral range at the end time point, and a large number of color temperatures between the red and violet spectral range of the color spectrum during the recording period.

18. The method according to claim 16, wherein the color temperature of the illumination light is changed stepwise or continuously between the starting time point and the end time point of the recording of the images from the beginning color temperature to the ending color temperature.

19. The method according to claim 18, wherein the color temperature of the illumination light is changed in proportion to the recording time.

20. The method according to claim 15 wherein the body carries out a temporally and spatially periodic movement with a periodicity time T, and wherein the recording time between the starting time point and the end time point corresponds to one-half the periodicity time T/2.

21. The method according to claim 15, wherein the camera comprise: a video, CCD, or CMOS camera.

22. The method according to claim 21, further comprising overlapping a large number of individual images that were recorded during the recording period in a single image using digital image processing means.

* * * * *

UNITED STATES PATENT AND TRADEMARK OFFICE
CERTIFICATE OF CORRECTION

PATENT NO. : 6,909,377 B2
DATED : June 21, 2005
INVENTOR(S) : Eberl

It is certified that error appears in the above-identified patent and that said Letters Patent is hereby corrected as shown below:

<u>Title page,</u>
Item [75], Inventor, delete "Probatried" and insert -- Probstried --.

<u>Column 9,</u>
Line 55, delete "(5)".

<u>Column 10,</u>
Line 8, delete "presets sets" and insert -- presets --.

<u>Column 11,</u>
Line 2, delete "comprise" and insert -- comprises --.

Signed and Sealed this

Sixteenth Day of May, 2006

JON W. DUDAS
*Director of the United States Patent and Trademark Office*